(12) United States Patent
Tateishi et al.

(10) Patent No.: US 8,403,684 B2
(45) Date of Patent: Mar. 26, 2013

(54) CONNECTOR HAVING A TERMINAL WITH A TIN PLATED CONTACT PRESSED AGAINST A HOT-DIP TINNED FACE OF A BOARD

(75) Inventors: Norikazu Tateishi, Tokyo (JP); Masaru Kibi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 162 days.

(21) Appl. No.: 13/131,047

(22) PCT Filed: Dec. 17, 2009

(86) PCT No.: PCT/JP2009/006977
§ 371 (c)(1),
(2), (4) Date: May 25, 2011

(87) PCT Pub. No.: WO2010/109569
PCT Pub. Date: Sep. 30, 2010

(65) Prior Publication Data
US 2011/0235348 A1    Sep. 29, 2011

(30) Foreign Application Priority Data

Mar. 23, 2009   (JP) .................................. 2009-070264

(51) Int. Cl.
*H01R 12/00* (2006.01)
(52) U.S. Cl. ........................................................ 439/83
(58) Field of Classification Search .................. 439/83, 439/862, 884–886
See application file for complete search history.

(56) References Cited

U.S. PATENT DOCUMENTS

| 6,110,823 A * | 8/2000 | Eldridge et al. ............. 438/660 |
| 6,336,269 B1 * | 1/2002 | Eldridge et al. ............. 29/885 |
| 6,641,410 B2 * | 11/2003 | Marvin et al. .................. 439/83 |
| 6,778,406 B2 * | 8/2004 | Eldridge et al. ............. 361/776 |
| 7,225,538 B2 * | 6/2007 | Eldridge et al. ............. 29/879 |
| 2006/0205290 A1 | 9/2006 | Narita |

FOREIGN PATENT DOCUMENTS

| JP | 63-192296 A | 8/1988 |
| JP | 1-62668 U | 4/1989 |
| JP | 2-57572 U | 4/1990 |
| JP | 6-44038 U | 6/1994 |
| JP | 8-22852 A | 1/1996 |
| JP | 10-199595 A | 7/1998 |
| JP | 2001-148261 A | 5/2001 |
| JP | 2004-134411 A | 4/2004 |
| JP | 2005-56605 A | 3/2005 |
| JP | 2006-216523 A | 8/2006 |
| JP | 2006-228669 A | 8/2006 |
| JP | 2008-26171 A | 2/2008 |
| JP | 2008-41566 A | 2/2008 |
| JP | 2008-192402 A | 8/2008 |

OTHER PUBLICATIONS

Computer English translation of JP-2008-41566-A dated Feb. 21, 2008.

* cited by examiner

*Primary Examiner* — Chandrika Prasad
(74) *Attorney, Agent, or Firm* — Birch, Stewart, Kolasch & Birch, LLP (57) ABSTRACT

A tin-plated surface 7 is formed by hot-dip coating a solder containing a lead-free tin as the main component on an electrode 6 of a board 4 with which a connector terminal 1 comes in contact.

13 Claims, 5 Drawing Sheets

CONNECTOR HAVING A TERMINAL WITH A TIN PLATED CONTACT PRESSED AGAINST A HOT-DIP TINNED FACE OF A BOARD

TECHNICAL FIELD

The present invention relates to a connector connecting structure for connecting a connector to a board of an electric apparatus and a lighting device for a light source of a vehicle-mounted headlamp, the lighting device using the structure.

BACKGROUND ART

In connecting a connector to a board of an electric apparatus, the connector is often soldered to the board in a process different from those of the other components on the board. For this reason, in the process of connecting the connector to the board of the electric apparatus, employment of a connecting unit not using soldering may improve the workability.

Conventional techniques for connecting the terminal of the connector to the board without the use of the soldering include a technique using a metallic resilient terminal, as disclosed in Patent Document 1, for example. The terminal is composed of a press-fit terminal in which a connection is carried out by insertion into a through hole of a board.

Further, Patent Document 2 discloses a connector that is attached to a terminal holder of a connector housing located on a board by a terminal of the connector being passed through the terminal holder, and the terminal on the board side of the connector is resiliently pressed against an electrode face located on the board, thus enhancing stability of electrical connections therebetween.

A connection terminal for a printed board disclosed in Patent Document 3 includes a terminal for establishing a connection between a tab terminal and the printed board, and has an electrode connecting section which is electrically connected to an electrode face located on the printed board by being resiliently pressed against the electrode face.

Patent Document 4 discloses a connector to be connected to a through hole of a board, such that by insertion into the through hole of the board, an insertion section provided at the terminal is resiliently fitted and fixed therein.

Further, Patent Document 5 discloses a press-fit terminal device in which to a press-fit terminal that is inserted in a through hole of a board and connected thereto, an arm that comes in contact with an electrode face on the board to be electrically connected to the electrode face is provided.

In the above-discussed conventional techniques, in electrically connecting a connector terminal to an electrode face provided on a board by pressing the terminal against the electrode face, the following is generally employed: one is a method of contacting a connector terminal to a copper surface of an electrode by breaking a rust preventive flux layer provided over the electrode surface by a strong force like press fit, or the other is a measure for retarding the oxidation of an contacting electrode surface of a board in order to prevent contact failures thereof.

On the other hand, an electrode on a board is sometimes positively used as a connector terminal by preventing the contact face of the electrode from being oxidized by coating the contact face of the board with gold plating, nickel platting, tin plating, or the like; in this case, a board processing by a plating process that is different from usual board manufacturing processes must be added thereto.

Note that in this case, the influence of the potential gradient between the metals cannot be disregarded. Therefore, there are a large number of examples such that in order to retard corrosion or oxidation caused by electrolytic corrosion to thereby prevent contact failures, a metal on the surface of a connector making face-to-face contacts with the electrode of a board is the same as that used for the electrode thereof, thus securing reliability of connector connection.

Moreover, it is necessary to add a process of removing flux and oil for soldering from the contact portion of a board to a board manufacturing process so that flux and oil do not adhere to the contact portion thereof, and further upgrade the manufacturing process so that foreign matters do not adhere thereto. This is a factor which increases the cost of components.

Such an increase of the number of manufacturing processes results in an increase of the difficulty of producing boards and connectors, thus also making inevitable an increase of manufacturing costs thereof.

PRIOR ART DOCUMENTS

Patent Documents

Patent Document 1: JU-A-1994-44038 (JU-A-06-44038)
Patent Document 2: JP-A-1996-22852 (JP-A-08-22852)
Patent Document 3: JP-A-1998-199595 (JP-A-10-199595)
Patent Document 4: JP-A-2001-148261
Patent Document 5: JP-A-2008-192402

SUMMARY OF THE INVENTION

In the prior art, in an arrangement where a connector terminal is connected to an electrode face on a board by pressing and contacting the terminal thereto, contact failures caused by electrolytic corrosion and oxidation occurring in the contact portion therebetween are not considered, and measures against those troubles are not clearly disclosed.

Particularly in a solder containing lead as the main component which has been mainstream in a conventional soldering, the occurrence of contact failures caused by oxidation on the surface of the solder is inevitable. Further, since due to softness of the lead, when normally pressed, the contact portion is deformed to reduce the pressing force; thus, an appropriate contact pressure cannot be maintained for a long time.

As discussed above, when the solder containing lead as the main component is applied to the contact portion, contact reliability thereof for along time cannot be secured, and thus in recent years, lead has come not to be used for a contact in an appliance from which high reliability is demanded.

The present invention has been made to solve the above-mentioned problems, and an object of the invention is to provide a structure for connecting a connector, such that contact reliability for a long time can be secured by plating a contact portion of a connector terminal with tin, also causing the contact portion to have resilience, and placing the contact portion in pressing contact with an electrode face on a board that is hot-dip tinned, to thus provide an electrical connection between the contact portion thereof and the electrode face, and another object is to provide a lighting device of a light source for a vehicle-mounted headlamp using the above structure.

A structure for connecting a connector according to the present invention is arranged as follows: an electrode of a board includes a hot-dip tinned face formed by hot-dip coating a lead-free solder containing tin as the main component on the surface thereof; a connector terminal includes a moving section having resilience and provided with a contact portion plated with tin; and the contact portion is pressed against the tinned face with the resilience of the moving section to provide an electrical connection between the connector terminal and the electrode face of the board.

According to the invention, the hot-dip tinned face formed by hot-dip coating the lead-free solder containing tin as the main component is provided on the surface the electrode of the board, and the contact portion is pressed against the tinned face with the resilience of the moving section having the tin-plated contact portion provided at the connector terminal to provide an electrical connection between the connector terminal and the electrode of the board. As mentioned above, solder containing lead as the main component is not employed, the faces which are plated with tin having a hardness higher than that of the solder are prepared as the contact faces between the connector terminal and the electrode of the board; thus, there is obtained an advantageous effect that the contact reliability for a longer time can be secured as compared with the conventional.

Further, the contact portion of the connector terminal where the terminal comes in contact with the board electrode is also plated with tin, and thus corrosion or oxidation by electrolytic corrosion is restrained to reduce the occurrence of contact failures, thereby enhancing the reliability of the connector connection.

Moreover, the contact portion is pressed against the tinned face with the resilience of the moving section to provide an electrical connection between the connector terminal and the electrode face of the board. Therefore, it is possible to connect the connector terminal to the electrode face of the board by a simple pressing operation, which can eliminate a soldering work of the connector terminal to thereby enhance the workability.

Besides, the use of solder containing tin as the main component, not containing lead, as the material of hot-dip tinning is also advantageous from the viewpoint of recent environments.

BEST MODE FOR CARRYING OUT THE INVENTION

Embodiments of the present invention will now be described with reference to the accompanying drawings in order to explain the present invention in more detail.

First Embodiment

Figure 1:
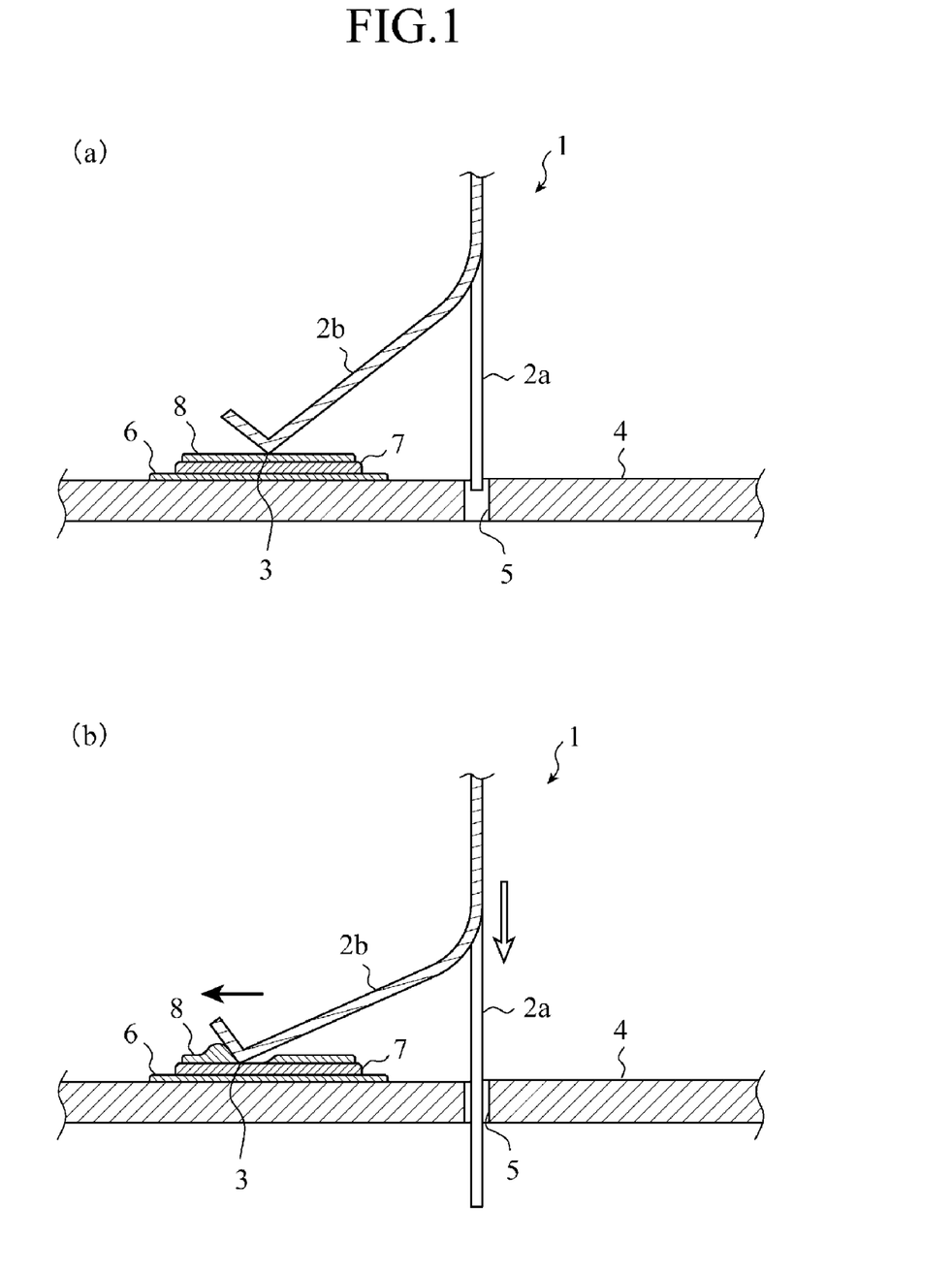
FIG. 1 is a view showing a connector connecting structure in accordance with a first embodiment of the present invention.

FIG. 1 is a view showing a connector connecting structure in accordance with a first embodiment of the present invention, and shows a cross-section of a board 4 with a connector terminal 1 taken in a longitudinal direction thereof. In a connector connecting structure in accordance with the first embodiment, the connector terminal 1 includes an insertion section 2a and a moving section 2b, and the insertion section 2a is inserted into a hole (through hole) 5 of a board 4 from the state shown in FIG. 1(a) in the direction of the white arrow shown in FIG. 1(b), thus providing an electrical connection between a contact portion 3 of the moving section 2b and a tinned face 7 of an electrode 6 on the board 4.

The moving section 2b of the connector terminal 1 is provided with jutting out obliquely with respect to an inserting direction of the insertion section 2a into the hole 5, and also has resilience to be flexible according to the operation of inserting the insertion section 2a into the hole 5 of the board 4. Further, in an example shown in FIG. 1, a bent apex (an edge section protuberant to the side of the board 4) formed by bending an end portion of the moving section 2b is used as the contact portion 3. Furthermore, at least a portion of the moving section 2b containing the contact portion 3 is plated with tin. Note that the end portion of the moving section 2b is bent to form the contact portion 3; however, without bending the end portion of the moving section 2b, an edge portion of an end face of a plate-shaped portion of the connector terminal serving as the moving section 2b may be used as the contact portion 3.

The electrode 6 provided on the board 4 is made of a copper foil, and tin plating is coated on the surface thereof. The tin plating implemented on the electrode 6 is performed by applying a molten solder containing tin as the main component, not containing lead, for example, to the electrode. As a hot-dip tin plating method, the following is employed: reflow soldering that applies solder cream containing tin as the main component to the surface of the electrode 6, and then subjects the board having the electrode to a reflow furnace, or flow soldering that dips the surface of the board 4 in the molten solder above. By carrying out the above method, the hot-dip tinning treatment can be performed in a process where electronic components to be mounted are soldered, and thereby a tinning process where the board 4 is solely tinned is eliminated, thus reducing the cost of the board 4.

In connecting the connector 1 to the board 4, as shown in FIG. 1(a), the insertion section 2a of the connector terminal 1 is disposed in the hole 5 of the board 4, and the contact portion 3 of the moving section 2b is disposed on the electrode 6 of the board 4. Thereafter, as the insertion section 2a is inserted into the hole 5 as shown in FIG. 1(b), the contact portion 3 is pressed against a flux layer 8 formed over the tinned face 7. Then, the insertion section 2a is further inserted thereinto to cause the moving section 2b to flex, and the deformation of the moving section 2b caused by the flexure thereof slides the contact portion 3 in the direction of the black arrow shown in FIG. 1(b) (along the face of the board 4). At this time, the flux layer 8 is wiped by the contact portion 3 to cause the tinned face 7 and the contact portion 3 to come in contact with each other and provide an electrical connection therebetween.

As discussed above, the first embodiment provides a structure where the contact portion 3 of the connector terminal 1 is supported by the resilient moving section 2b, and the resilience of the moving section 2b presses the tin plated contact portion 3 against the tinned face 7 on the surface of the electrode 6, thus providing an electrical connection therebetween. This enables a soldering work of the connector terminal 1 to be eliminated, thereby enhancing the ability of the connector terminal to be worked. Further, since the contact portion 3 is formed by using the edge portion protuberant to the side of the board 4, the contact portion 3 breaks the flux layer 8 located over the tinned face 7 to wipe the flux layer. Thus, it is possible to make sure that the contact portion 3 and the tinned face 7 are positively connected to each other, contact failures are avoided, and reliability thereof is enhanced.

It is to be noted that in FIG. 1, an arrangement is shown in which the connector terminal 1 is provided with the insertion section 2a, and the insertion section 2a is inserted into the hole 5 of the board 4, thus pressing the contact portion 3 to the side of the electrode 6. However, it may be arranged that the insertion section 2a is not provided and that the contact portion 3 is simply pressed against the board 4 to provide an electrical connection between the contact portion and the tinned face 7. In this case, the contact is carried out within the range that the rigidity of the board 4 and a chassis case (not shown) of an electric apparatus on which the board 4 is fixed is permitted relative to the force pressing the contact portion 3 against the board 4. However, there is a possibility that the pressing force reduces due to the flexure of the board 4 and the distortion of the chassis case.

Figure 2:
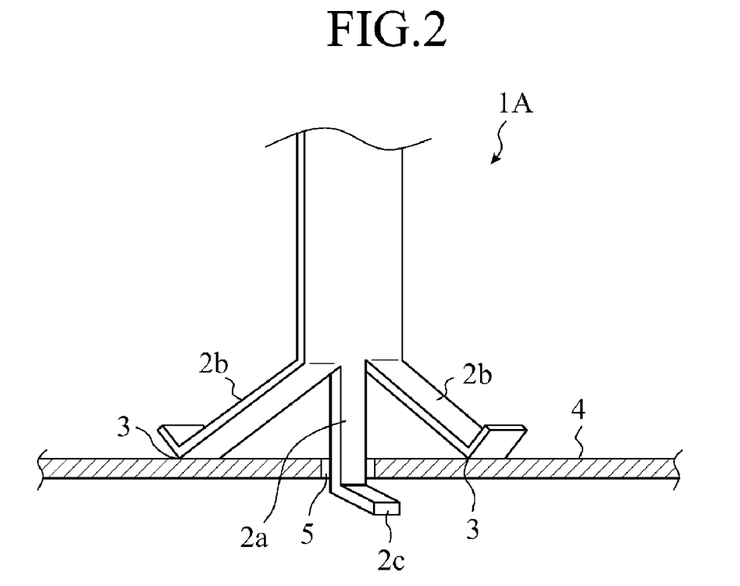
FIG. 2 is a view showing Constructive Example 1 of a connector terminal arrangement in accordance with the first embodiment.

FIG. 2 is a view showing Constructive Example 1 of a connector terminal arrangement in accordance with the first embodiment, and shows a cross-section of the board 4 taken in a longitudinal direction. Hereupon, in FIG. 2, for the simplicity of the following explanations, the illustrations of the electrode 6, the tinned face 7, and the flux layer 8 on the board 4 are omitted. In a connector terminal 1A shown in FIG. 2, one end portion of a tin plated plate-shaped member is longitudinally partially cut at two places to form three reed-shaped portions, the central portion is used as the insertion section 2a, and both side portions (plate-shaped portions) are bent opposite from each other so as to project obliquely to the insertion section 2a, thus forming two moving sections 2b. As in the case of FIG. 1, the end portion of each of the moving sections 2b is bent to form a bent apex (an edge section protuberant to the side of the board 4), and the bent apex is used as a contact portion 3. Hereupon, without bending the end portion of the moving section 2b, the edge portion of an end of each of the plate-shaped portions of the connector terminal serving as the moving sections 2b may be used as the contact portion 3.

In the connector terminal 1A, the insertion section 2a is inserted into the hole 5 of the board 4, and at the point of time when the tinned face 7 of the board 4 and the contact portion 3 come in contact with each other as in the case of FIG. 1(b), the tip portion of the insertion section 2a passing through the board 4 via the hole 5 is bent to the back side of the board 4 as shown in FIG. 2. A bend section 2c formed by the bending abuts against the board 4, thereby the resilience of the moving section 2b counteracts the force working in the direction where the insertion section 2a is disconnected from the hole 5, thus fixing the connector terminal 1A to the board 4 under a condition where the tinned face 7 and the contact portion 3 are press-contacted to each other.

As described above, since the connector terminal 1A is fixed by the bend section 2c formed at the tip portion of the insertion section 2a, the connector terminal 1A comes to support the moving section 2b consisting of the resilient member of the connector terminal by itself, thus enabling the contact portion 3 to be positively, firmly, and stably pressed against the tinned face 7 of the board 4. In this manner, a stable pressing force can be secured, and the reliability of connection between the connector terminal 1A and the board can be increased. Further, the connector terminal is fixed by bending the tip portion of the insertion section 2a, which can eliminate a soldering work, and also provide a positive fastening by a simple work to thus enhance the workability.

Further, when a plate-shaped portion of the connector terminal 1A is partially cut and raised to form a plurality of moving sections 2b, a plurality of contact portions 3 can be in contact with the tinned face 7 of the electrode 6 of the board 4, thus enabling the contact area where the contact portions 3 come in contact with the tinned face 7 to be increased and also the contact resistance to be reduced, and enabling the heat generation originating from the current passed through the connector terminal 1A to be reduced. In other words, the current that can be passed through the connector terminal 1A can be increased. Note that the plate-shaped member is partially cut and raised to form the moving sections 2b, and thus the number of components used in the present invention does not increase.

Figure 3:
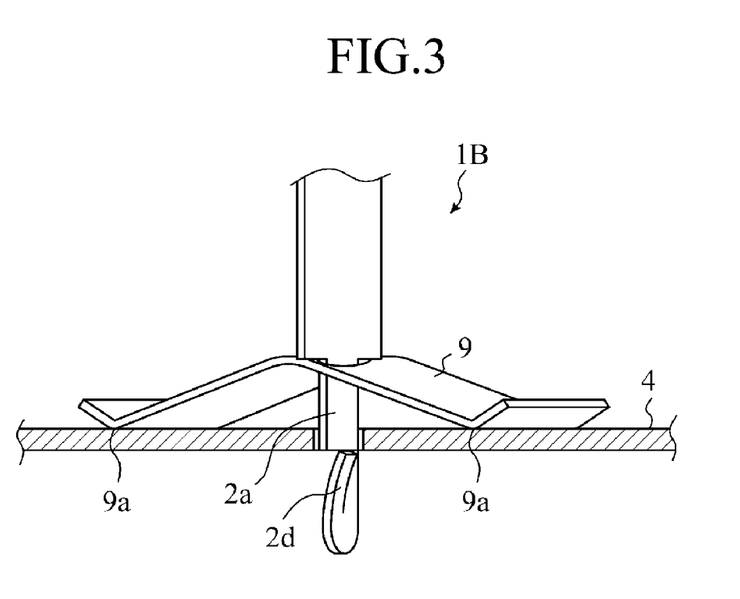
FIG. 3 is a view showing Constructive Example 2 of a connector terminal arrangement in accordance with the first embodiment.

FIG. 3 is a view showing Constructive Example 2 of a connector terminal arrangement in accordance with the first embodiment, and shows a cross-section of the board 4 taken in a longitudinal direction. As in the case of FIG. 2 above, in FIG. 3 also, the illustrations of the electrode 6, the tinned face 7, and the flux layer 8 on the board 4 are omitted. In a connector terminal 1B shown in FIG. 3, a moving section 9 is constructed with a plate-shaped member provided separately from an insertion section 2a. The moving section 9 includes a leaf spring that is formed by bending a central portion in the lengthwise direction of the plate-shaped member, and is provided at the central portion thereof an insertion hole to be inserted by the insertion section 2a.

Further, in the example shown in FIG. 3, the plate-shaped member serving as the moving section 9 is bent at each end portion in the lengthwise direction thereof in the direction opposite from the bending of the central portion, and each of bent apexes (edge sections protuberant to the side of the board 4) thus formed is used as a contact portion 9a. In passing, without forming the contact portion 9a by bending each end portion of the plate-shaped member, an edge portion of each end of the plate-shaped member may be used as the contact portion 9a.

Furthermore, a cut line is formed at the tip of the insertion section 2a in advance; a portion of the tip is raised along the cut line, thus forming a claw 2d protruding obliquely to the insertion direction of the insertion section 2a.

The diameter of the insertion hole provided through the moving section 9 has enough size for insertion of the insertion section 2a, but narrower than the width of the main body of the terminal which is connected with the insertion section 2a. For this reason, as the insertion section 2a is passed through the insertion hole of the moving section 9 and then is inserted into the hole 5 of the board 4, the main body of the terminal abuts against the moving section 9, and the moving section 9 presses the leaf spring. At the point of time when the tinned face 7 and the contact portions 9a come in contact with each other due to the resilience of the leaf spring as in the case of FIG. 1(b), the tip portion of the insertion section 2a extended through the board 4 via the hole 5 is cut and raised along the cut line as shown in FIG. 3 so as to protrude obliquely to the insertion direction of the insertion section 2a. The claw 2d thus formed abuts against the board 4, which causes the resilience of the moving section 9 to counteract the force working in the direction where the insertion section 2a comes off the hole 5, to fix the connector terminal 1B to the board 4 under a condition where the tinned face 7 and the contact portions 9a are placed in a press-contacted relationship to each other.

As mentioned above, in the connector terminal 1B, by employing the leaf spring provided separately from this terminal, the moving section 9 having a simple structure can be formed. Further, since the claw 2d formed at the tip of the insertion section 2a serves as a retainer, a simple work of pushing the insertion section 2a into the hole 5 of the board 4, and then partially cutting and raising the tip portion thereof to be penetrated enables the connector terminal 1B to be fixed to the board 4, which eliminates a soldering work to thus improve the workability.

Figure 4:
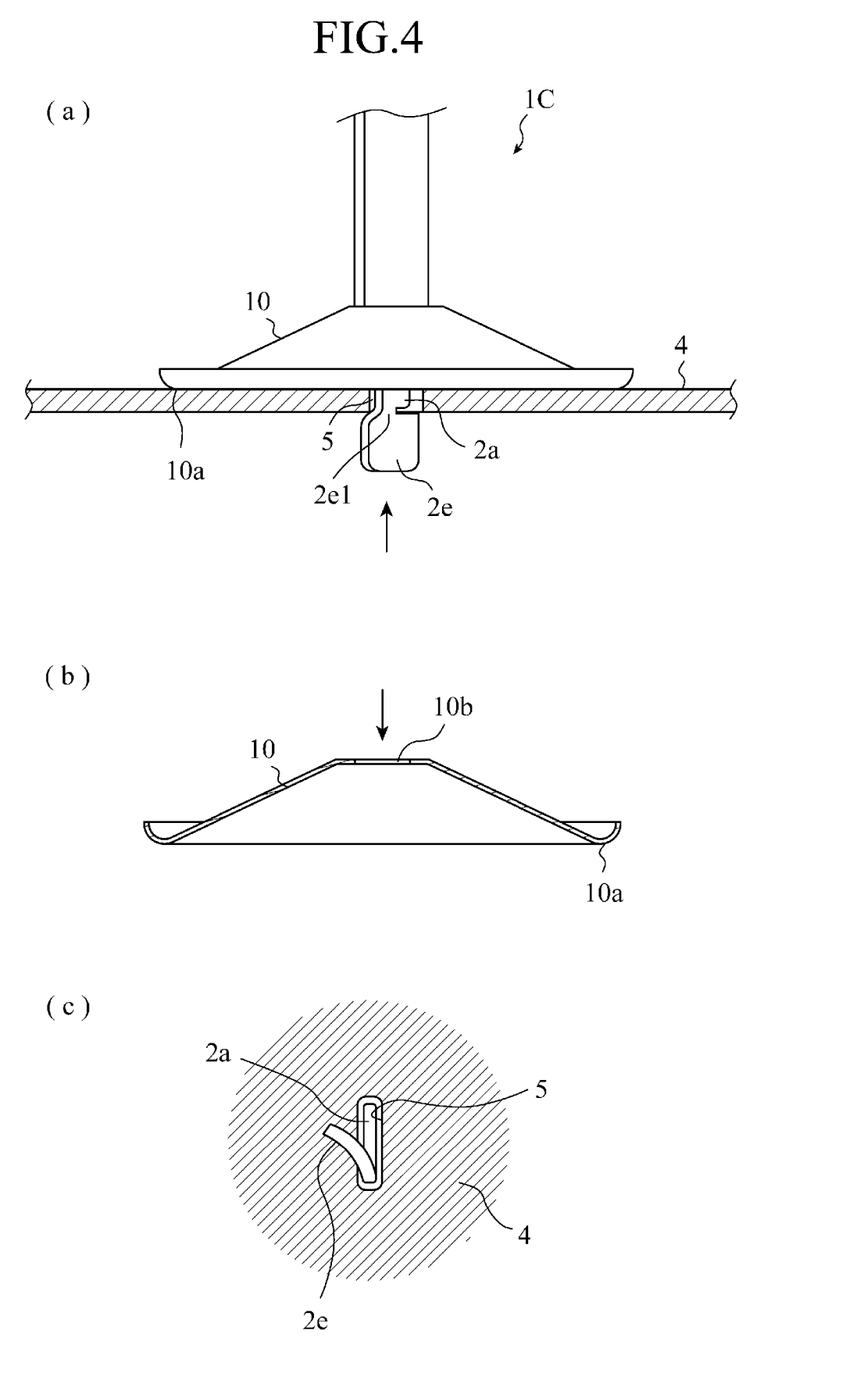
FIG. 4 is a view showing Constructive Example 3 of a connector terminal arrangement in accordance with the first embodiment.

FIG. 4 is a view showing Constructive Example 3 of a connector terminal arrangement in accordance with the first embodiment; FIG. 4(a) shows the cross-section of the board 4 taken in the longitudinal direction and a connector terminal 1C, FIG. 4(b) shows a longitudinal cross-section of a moving section 10, and FIG. 4(c) shows a view seen from the direction indicated by the arrow shown in FIG. 4(a). As in the case of FIG. 2, in FIG. 4 also, the illustrations of the electrode 6, the tinned face 7, and the flux layer 8 on the board 4 are omitted.

In the connector terminal 1C, the moving section 10 is constructed with a dish-shaped member provided separately from the insertion section 2a. As the dish-shaped member, a dish-shaped spring is used, which produces resilience when the spring is pressed in the direction indicated by the arrow as shown in FIG. 4(b). Moreover, as shown in FIG. 4(b), a circumference section 10a of the dish-shaped spring including a bent apex formed by upward bending the outer periphery of the dish-shaped spring is used as a contact portion. Further, an insertion hole 10b for passing through the insertion section 2a is provided through the central portion of the dish-shaped spring serving as the moving section 10.

The diameter of the insertion hole 10b has enough size for insertion of the insertion section 2a, but narrower than the width of the main body of the terminal which is connected with the insertion section 2a. For this reason, as the insertion section 2a is passed through the insertion hole 10b of the moving section 10 and then is inserted into the hole 5 of the board 4, the main body of the terminal abuts against the dish-shaped spring, and the dish-shaped spring is pressed in the direction of the arrow shown in FIG. 4(b). In this manner, a flexure such that the dish-shaped spring radially-outwardly extends from the center thereof is produced, and the circumferential section 10a slides along the face of the board 4 to wipe out a flux layer 8.

In this context, without bending the outer periphery of the dish-shaped spring serving as the moving section 10, an edge portion of the outer peripheral end face of the dish-shaped spring may be used as the contact portion. Further, a cut line is previously provided at the tip of the insertion section 2a, and a portion of the tip is twisted or bent along the cut line to form a twist section 2e. To easily twist the tip, a constriction section 2e1 may be formed at the portion where the cut line is provided as shown in FIG. 4(a).

In the connector terminal 1C, when the insertion section 2a thereof is passed through the insertion hole 10b of the moving section 10, and then inserted into the hole 5 of the board 4; thus, at the point of time when the tinned face 7 and the circumference section 10a that is a contact portion come in contact with each other by wiping as, in the case of FIG. 1(b), the tip portion of the insertion section 2a extended through the board 4 via the hole 5 is twisted or bent at the cut line portion about the insertion direction as shown in FIG. 4(a) and FIG. 4(c). A twist section 2e formed by the bending abuts against the board 4 as shown in FIG. 4(c), thus causing the resilience of the moving section 10 to oppose the force working in the direction where the insertion section 2a comes off the hole 5, and fixing the connector terminal 1C to the board 4 under a condition where the tinned face 7 and the circumference section 10a are placed in a press-contacted relationship to each other.

As discussed above, in the connector terminal 1C, by employing the dish-shaped spring, the moving section 10 having a simple structure can be formed. Further, since the twist section 2e formed at the tip of the insertion section 2a serves as a retainer, a simple work of pressing the insertion section 2a into the hole 5 of the board 4 and of twisting or bending the tip portion extending therethrough enables the connector terminal 1C to be fixed to the board 4, which eliminates a soldering work to thus improve the workability.

Figure 5:
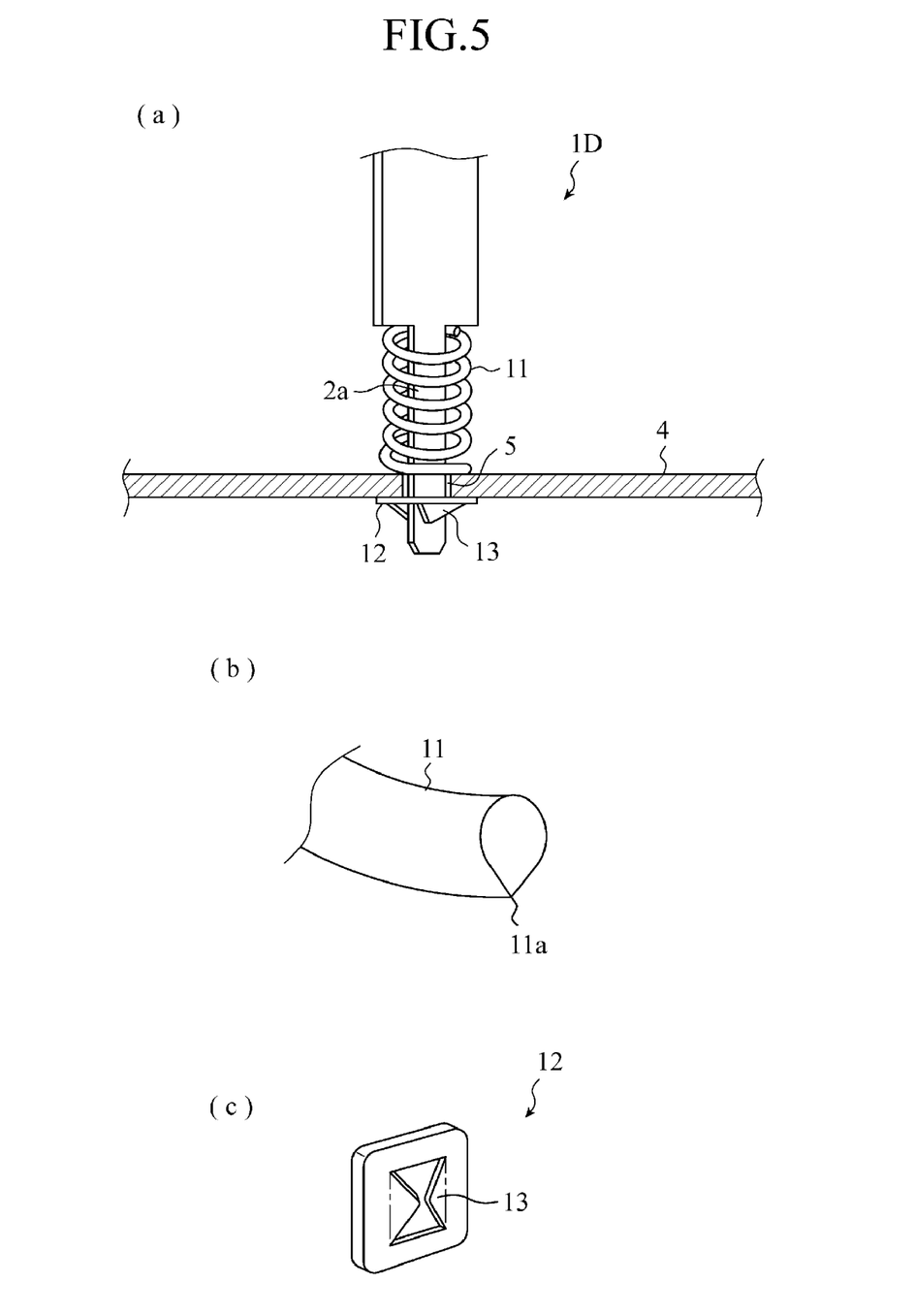
FIG. 5 is a view showing Constructive Example 4 of a connector terminal arrangement in accordance with the first embodiment.

FIG. 5 is a view showing Constructive Example 4 of a connector terminal arrangement in accordance with the first embodiment; FIG. 5(a) shows a cross-section of the board 4 taken in a longitudinal direction, FIG. 5(b) shows an end portion of a coil spring serving as a moving section 11, and FIG. 5(c) is a perspective view showing a clip serving as a fixing member. As in the case of FIG. 2, in FIG. 5 also, the illustrations of the electrode 6, the tinned face 7, and the flux layer 8 on the board 4 are omitted. A connector terminal 1D uses a coil spring provided separately from an insertion section 2a as a moving section 11.

A coil spring having a contact portion of which the cross-sectional circle is partially formed in an edge shape as shown in FIG. 5(b), for instance, is employed for the coil spring working as the moving section 11, and such an edge section 11a is used as a contact portion. Further, when the coil spring is formed, a wire material of polygonal cross-section (e.g., square cross-section) is employed, and a coil spring of which the corner portion is pointed toward an axial direction of the winding is formed, thus also enabling the edge of the wire corner of the coil spring end portion to be used as a contact portion.

The diameter of the coil spring has enough size for insertion of the insertion section 2a, but narrower than the width of the main body of the terminal which is connected with the insertion section 2a. For this reason, as the insertion section 2a is passed through the internal interstice of the coil spring and then is inserted into the hole 5 of the board 4, the main body of the terminal abuts against the coil spring, and the coil spring is pressed as shown in FIG. 5(a). In this manner, the edge section 11a of the coil spring is twisted along the face of the board 4 to wipe a flux layer 8.

In the connector terminal 1D, when the insertion section 2a thereof is passed through the coil spring of the moving section 11, and inserted into the hole 5 of the board 4; thus, at the time when the tinned face 7 and the edge section 11a that is a contact portion come in contact with each other by wiping, as in the case of FIG. 1(b), the tip portion of the insertion section 2a extended through the board 4 via the hole 5 is fitted in a clip (retaining member) 21 shown in FIG. 5(a) and FIG. 5(c), and thereby a lock section 13 of the clip 12 locks the insertion section 2a. At this time, the clip 12 abuts against the board 4 as shown in FIG. 5(a) to counteract the force working in the direction where the insertion section 2a is disconnected from the hole 5 due to the coil spring, thus fixing the connector terminal 1D to the board 4 under a condition where the tinned face 7 and the edge section 11a are placed in a press-contacted relationship to each other.

As discussed above, in the connector terminal 1D, the use of the coil spring enables the moving section 11 having a simple structure to be formed. Furthermore, since the clip 12 fitted to the tip of the insertion section 2a is used for a retainer, a simple work of pushing the insertion section 2a into the hole 5 of the board 4, and then attaching the clip 12 to the penetrated tip portion thereof enables the connector terminal 1D to be fixed to the board 4, which eliminates a soldering work to thus enhance the workability.

In this context, the connector terminal used in the connector connecting structure according to the present invention is not limited to the arrangements of FIG. 1 to FIG. 5, and a connector terminal combining appropriately the arrangements of the insertion sections, the moving sections, and the retaining members of the connector terminals illustrated in FIG. 1 to FIG. 5 may be also employed therefor. For example, in the arrangement of FIG. 2, the bend section 2c may be also substituted by any one of the claw 2d shown in FIG. 3, the twist section 2e shown in FIG. 4, and the clip 12 shown in FIG. 5.

As discussed above, in accordance with the first embodiment, the contact portion of the connector terminal 1 is plated with tin and also equipped with resilience, and the contact portion is pressed or contacted to the tinned face 7 formed on the electrode 6 of the board 4 to provide an electrical connection therebetween. In this manner, a solder containing lead as the main component is not employed, while the tinned face 7 having a higher hardness is employed as one of the contact faces between the connector terminal 1 and the electrode 6 of the board 4; thus, the contact reliability for a long time can be secured as compared with the conventional. Further, the contact portion 3 of the connector terminal 1 is also plated with tin, and therefore corrosion or oxidation by electrolytic corrosion is restrained from occurring to reduce the occurrence of contact failures, thus enhancing the reliability of the connector connection. Moreover, the contact portion is pressed against the tinned face with the resilience of the moving section to provide an electrical connection between the connector terminal and the electrode of the board, and thus it is possible to connect the connector terminal and the electrode to each other by a simple pressing operation, which eliminate a soldering work of the connector terminal to thus enhance the workability.

Besides, in accordance with the first embodiment, the connector terminal 1 is provided with the insertion section 2a to be inserted into the hole 5 of the board 4, and is provided with the retaining section for preventing the insertion section 2a extended through the board 4 via the hole 5 from being disconnected from the hole. Therefore, the connector terminal 1 comes to support the moving section thereof by itself, thus enabling the contact portion of the terminal to be positively, firmly, and stably pressed against the electrode 6 of the board 4. In such a way, stable pressing force can be secured, and the reliability of connection between the connector terminal 1 and the board can be increased.

Second Embodiment

In a second embodiment, an arrangement will be discussed in which a connector connecting structure shown in the first embodiment is applied to at least one of a source power input connecting section and a connecting section for outputting power for a light source in a lighting device for lighting a light source for a vehicle-mounted headlamp.

Figure 6:
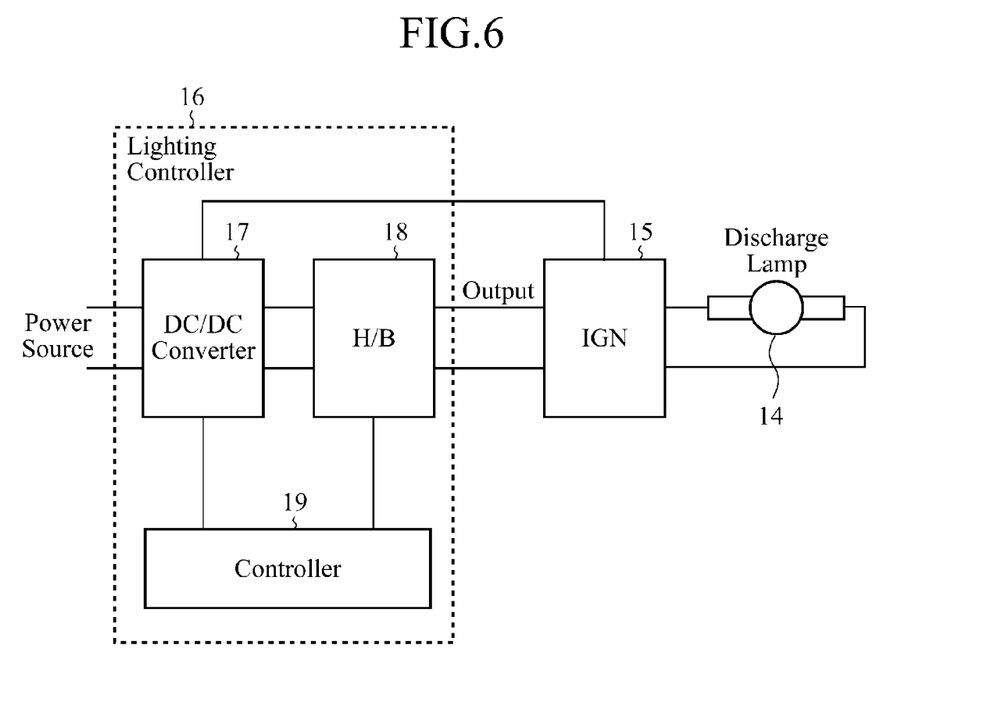
FIG. 6 is a block diagram showing schematically an arrangement of a lighting device in accordance with a second embodiment of the present invention.

FIG. 6 is a block diagram showing schematically an arrangement of a lighting device in accordance with the second embodiment of the present invention. Referring to FIG. 6, the lighting device in accordance with the second embodiment includes a discharge lamp 14, an igniter (IGN) 15, and a lighting controller (controlling unit) 16. The igniter 15 triggers the discharge lamp 14 to discharge by using the power source voltage for the igniter inputted thereto from the lighting controller 16. The lighting controller 16 is a unit that inputs power thereto from a power source and outputs the light source power for lighting the discharge lamp 14, and the lighting controller includes a DC/DC converter 17, a DC/AC inverter 18, and a controller (controlling unit) 19.

The DC/DC converter 17 generates a DC voltage for the light source and generates a power source voltage for the igniter from the DC voltage of the power source. The DC/AC inverter 18 is an H bridge type (H/B) inverter formed by connecting, for example, two pairs of switching elements in an H shape, inputs thereto the DC voltage obtained with the DC/DC converter 17, and outputs the voltage as an AC voltage for the light source. The controller 19 controls the drives of the DC/DC converter 17 and the DC/AC inverter 18. Hereupon, external connections in the lighting controller 16 are as follows: a connection of two conductor lines (source power input connecting section) with the power source; and a connection of three conductor lines for outputting (connecting section for outputting power for the light source, containing an igniter power connecting section).

The connector terminal used in the connector connecting structure in accordance with the above first embodiment has to have a shape for pressing the contact portion against the board 4, and thus the connector terminal becomes large in size as compared with the one that is simply soldered and connected. However, in an appliance having a few conductor lines to be connected with a connector terminal like the lighting controller 16 as shown in FIG. 6, or an appliance where a space occupied by a connector connecting structure is comparatively allowed, the size of the connector terminal does not become a large problem.

Figure 7:
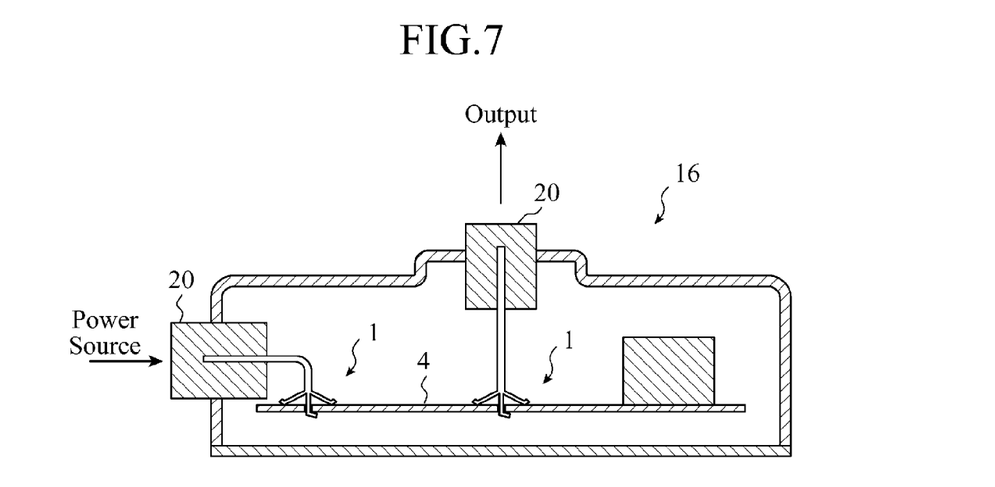
FIG. 7 is a sectional view showing schematically the lighting controller illustrated in FIG. 6.

FIG. 7 is a sectional view showing schematically a lighting controller in FIG. 6, and shows an arrangement where the connector connecting structure in accordance with the first embodiment is applied to the controller. Referring to FIG. 7, a chassis case of the lighting controller 16 has to have a waterproof structure; thus, after attaching a connector terminal 1 to the chassis case through a waterproof power supply connection connector 20, the board 4 having the arrangement shown in FIG. 6 mounted thereon is inserted into the chassis case to be fixed.

As mentioned above, in a general discharge lamp lighting device, it is necessary to attach a connector terminal to a chassis case in advance. Therefore, a terminal, which is press-fit into aboard by high pressure to be fixed thereto like a press fit terminal, cannot be used for the lighting device, because a high pressure cannot be applied after attaching the terminal to a chassis case.

In contrast, the connector terminal 1 in accordance with the above first embodiment can be fixed to a board while drawing an insertion section 2a having passed through the board 4, and a high pressure need not be applied, thus enabling the connector terminal to be suitably used. For example, as shown in FIG. 7, in at least one of the source power input connecting section and the connecting section for outputting power for the light source of the lighting controller 16, an electrode face of a board 4 is hot-dip tinned, and the board is connected to a terminal using the connector terminal 1 (or any one of the connector terminals 1A-1D) in accordance with the above first embodiment.

As discussed above, in accordance with the second embodiment, the connector connecting structure shown in the above first embodiment is applied to at least one of the source power input connecting section and the connecting section for outputting power for the light source, in a lighting device for lighting a light source for a vehicle-mounted headlamp, and thus the source power input connecting section and the connecting section for outputting power for the light source can be each positively connected to the lighting controller by a simple work.

Hereupon, in the second embodiment, the lighting device for lighting the discharge lamp is discussed by way of example; however, also in the case where the connector connecting structure is applied to a lighting device using an LED as the light source for the headlamp, a similar advantageous effect can be obtained because the arrangements of the source power input connecting section and the connecting section for outputting power for the light source are substantially similar to the discharge lamp.

INDUSTRIAL APPLICABILITY

The connector connecting structure according to the present invention provides an effect that long-term contact reliability and the like can be obtained, and thus the connector connecting structure is suitable for use in a lighting device of a light source for a vehicle-mounted headlamp and the like employing the above connection structure.

The invention claimed is:

1. A connector connecting structure for electrically connecting a connector terminal to an electrode face of a board, comprising:
    a hot-dip tinned face formed by hot-dip coating lead-free solder containing tin as the main component on the surface of the electrode face of the board; and
    a moving section having resilience and provided with a tin plated contact portion in the connector terminal,
    wherein it is constructed that the contact portion is pressed against the electrode face of the board by resilience of the moving section.

2. The connector connecting structure according to claim 1, wherein the moving section includes a plate-shaped or a stick-shaped portion formed by partially cutting and raising a portion of the connector terminal.

3. The connector connecting structure according to claim 1, wherein the moving section is a plate-shaped spring provided by abutting against the connector terminal.

4. The connector connecting structure according to claim 1, wherein the moving section is a dish-shaped spring provided by abutting against the connector terminal.

5. The connector connecting structure according to claim 1, wherein the moving section is a coiled spring provided by abutting against the connector terminal.

6. The connector connecting structure according to claim 1, wherein the contact portion formed at a portion of the moving section is provided with an edge.

7. The connector connecting structure according to claim 1, wherein as the contact portion formed at a portion of the moving section is pressed against the electrode face of the board, the contact portion is displaced along the face of the board on the tinned face.

8. The connector connecting structure according to claim 1, wherein the board includes a through hole, the connector terminal includes the contact portion for coming in contact with the electrode face of the board and an insertion section to be inserted into the through hole, and the insertion section includes a retaining section for fixing the portion penetrating the through hole.

9. The connector connecting structure according to claim 8, wherein the retaining section is a bend section which is formed by bending the penetrating portion of the insertion section to the side of the board.

10. The connector connecting structure according to claim 8, wherein the retaining section is a claw provided at an end of the insertion section, and locked by opening the portion penetrating the through hole of the board.

11. The connector connecting structure according to claim 8, wherein the retaining section is a twist section formed by turning or bending the penetrating portion of the insertion section in a turning direction about the insertion direction.

12. The connector connecting structure according to claim 8, wherein the retaining section is a retaining member attached to the penetrating portion of the insertion section.

13. A lighting device of a light source for a vehicle-mounted headlamp, comprising:
    a lighting controller for inputting power from a vehicle-mounted power source and outputting light source power for the light source for the headlamp,
    wherein at least one of a connecting section for inputting of the power of the lighting controller and a connecting section for outputting of the light source power is connected by using a connector connecting structure as set forth in claim 1.

* * * * *